United States Patent
Dietrich et al.

(10) Patent No.: US 10,075,140 B1
(45) Date of Patent: Sep. 11, 2018

(54) ADAPTIVE USER INTERFACE CONFIGURATION

(71) Applicant: AMAZON TECHNOLOGIES, INC., Reno, NV (US)

(72) Inventors: Douglas Sim Dietrich, Los Gatos, CA (US); Eric Peter Raeber, Redwood City, CA (US)

(73) Assignee: Amazon Technologies, Inc., Reno, NV (US)

( * ) Notice: Subject to any disclaimer, the term of this patent is extended or adjusted under 35 U.S.C. 154(b) by 465 days.

(21) Appl. No.: 14/315,089

(22) Filed: Jun. 25, 2014

(51) Int. Cl.
*H03G 3/20* (2006.01)

(52) U.S. Cl.
CPC .................................... *H03G 3/20* (2013.01)

(58) Field of Classification Search
CPC ...................................................... H03G 3/20
USPC .......... 709/231, 219; 381/107, 307; 725/136
See application file for complete search history.

(56) References Cited

U.S. PATENT DOCUMENTS

| | | | | |
|---|---|---|---|---|
| 2007/0022465 A1* | 1/2007 | Rothschild | ........... | G11B 27/105 725/136 |
| 2014/0359151 A1* | 12/2014 | Hansen | ............... | H04L 65/1083 709/231 |
| 2016/0191591 A1* | 6/2016 | Rider | ...................... | G06F 17/30 709/219 |

* cited by examiner

Primary Examiner — Md S Elahee
(74) Attorney, Agent, or Firm — Lindauer Law, PLLC

(57) ABSTRACT

Media devices present content such as games, audiobooks, music, movies, and so forth. During presentation of content, usage data may be acquired which provides information about how the media device is configured to present the content. For example, the usage data may indicate at which times during presentation that a user has increased or decreased volume for presentation of a movie. Information from a plurality of users may be analyzed to develop a presentation profile, which indicates at what times in the movie users have increased or decreased volume. During subsequent presentation of the content, a media device may use the presentation profile to adjust presentation settings of the content without user intervention.

20 Claims, 8 Drawing Sheets

ADAPTIVE USER INTERFACE CONFIGURATION

BACKGROUND

Media devices may present content such as movies, audiobooks, music, and so forth. The media devices may include set-top boxes (STBs), televisions, tablet computers, laptop computers, smartphones, desktop computers, media players, and so forth.

Figure 1:
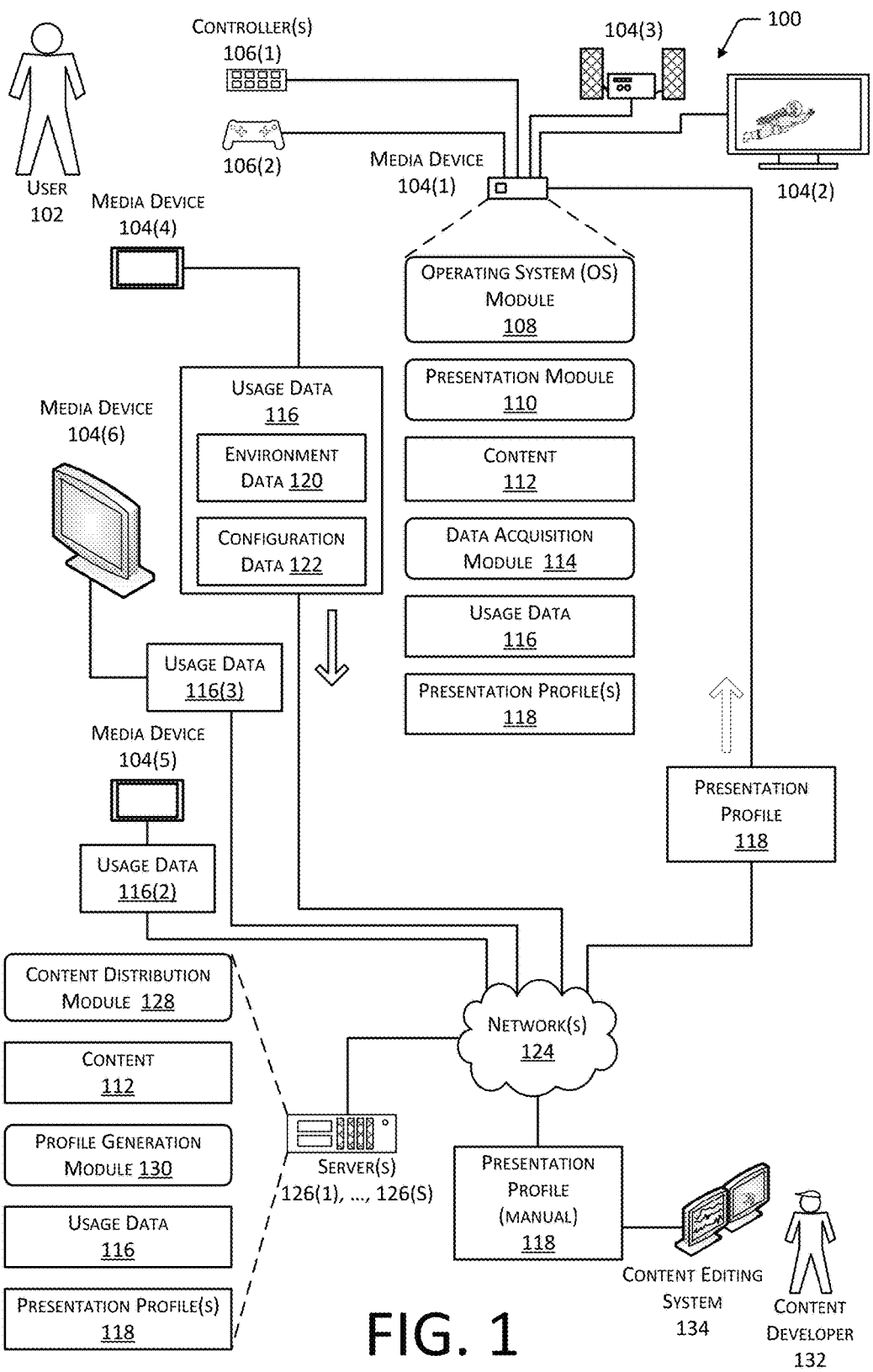
FIG. 1 is a system for generating a presentation profile based on usage data obtained from a plurality of media devices.

Certain implementations and embodiments will now be described more fully below with reference to the accompanying figures, in which various aspects are shown. However, various aspects may be implemented in many different forms and should not be construed as limited to the implementations set forth herein. Like numbers refer to like elements throughout.

DETAILED DESCRIPTION

Content such as video, music, audiobooks, applications including games, and so forth may be presented or otherwise consumed using a variety of media devices. These media devices may include televisions, set-top boxes, tablet computers, laptop computers, smartphones, desktop computers, media players, in-vehicle entertainment systems, and so forth.

Traditionally, users may manually adjust configuration settings of the media device during presentation. These configuration settings may include volume settings, display brightness settings, selection of a particular controller to accept input from, and so forth. Manual adjustment of these configuration settings may occur during presentation of the content. For example, users may decrease a volume level on the media device during particularly loud portions of a movie, while increasing the volume during quieter scenes. In another example, the users may decrease volume levels when games are being played using the media device, and may increase volume levels when movies are presented.

Conditions in the environment associated with the media device may change, which may encourage changes in the configuration settings. For example, a different user with different preferences may use the media device, the user may connect or disconnect headphones to the user device, ambient noise around the media device may increase, the user may decrease the volume of presentation late at night or early in the morning, and so forth.

Manual adjustments to the configuration settings may lead to adverse user experiences. For example, users may be distracted from the presentation while trying to change configuration settings. In another example, users may be unable to consume content effectively due to output audio volume which is too low or too high, or because an image is too dark or too bright.

The media device may rely on one or more external output devices, such as another media device to generate output. For example, a set-top box (STB) may send a digital signal or a line-level analog signal to one or more external devices. These external devices may then provide output to the user, such as a television to provide visual output, an audio/video receiver (AVR) to provide audio output, or a combination thereof.

The media device may be configured to change operation of another media device or output device to which it is connected. For example, the STB may use commands sent along a Consumer Electronic Control (CEC) link on a high definition multimedia (HDMI) interface such as "System Audio Control" commands including "Volume Up" to increase or "Volume Down" to decrease amplification provided by the AVR. Continuing this example, the STB may provide the AVR with an audio stream which is expressed as a digital signal. The AVR may convert or otherwise process the digital signal into an analog signal which is amplified and used to operate a speaker to generate audio output.

In other situations, the media device may be unable to change the operation of another media device or output device to which it is connected. For example, the AVR connected to the STB may be unable to process or implement CEC or other commands from the STB to change volume level or amplification level. As a result, traditional systems may involve the cumbersome process of the user manipulating a discrete control of the AVR to change the volume of audio output for the content.

In other situations, the media device may omit the ability to make a particular configuration change. Continuing the example above, controls to change the volume or another configuration setting may be absent from the STB. As a result, in traditional systems the user may again have to use the cumbersome process of manipulating the controls of the AVR to change the volume of audio output for the content.

Described in this disclosure are systems and techniques which provide for automatic adjustment of one or more configuration settings before or during presentation of content. Usage data associated with presentation of content is acquired from a plurality of media devices. The usage data provides information indicative of the changes made to the configuration of the media device. For example, the usage data may indicate that a volume level of the media device was changed, display brightness was adjusted, and so forth. These changes may be associated with particular positions within the content. The position of the content indicates a particular point in that content, and may be represented by one or more of a time index, frame number, scene indicator, game level, byte count, and so forth. For example, usage data may indicate that at time index 01:03:12 (hours:minutes:seconds) a user increased volume to 10% above an origin value, while at time index 01:27:09 the user decreased volume to 6% below the origin value.

The usage data from a plurality of users, media devices, or combination thereof may be processed to generate a presentation profile. The processing may include the application of one or more mathematical or statistical operations to the usage data. For example, an average of the volume levels obtained from a plurality of media devices at time index 01:03:12 may be used to generate volume configuration for that position in the content.

The presentation profiles may be associated with particular content, categories of content, and so forth. For example, a first presentation profile is associated with the movie titled "Short Circuit", while a second presentation profile is associated with games, and so forth. In some implementations, the same content may have a different presentation profiles. Continuing the example, a third presentation profile associated with a particular demographic section of users may be associated with the movie title "Short Circuit". A single presentation profile selected from a plurality of presentation profiles may be used during presentation, several presentation profiles may be merged to form an aggregate presentation profile, and so forth.

The presentation profile is provided to a recipient media device for use during presentation of the content. The presentation profile contains configuration data which may be used to change or configure one or more settings of the recipient media device. For example, the configuration data may be indicative of a change in volume and may be associated with one or more positions in the content. Continuing the example above, the volume setting of +10% relative to an origin may be associated with a span of time bracketed by time indices of 01:03:12 to 01:27:09. By using the presentation profile, configuration changes may be made to the recipient device which is presenting content. These changes occur automatically, and without user intervention. The media device may provide the user with the ability to override or discontinue use of the presentation profile. For example, use of the presentation profile may be discontinued after the user has manually changed the volume more than a threshold number of times.

The presentation profile may be configured to provide configuration data which is absolute or relative. Absolute configuration data may be expressed relative to a reference standard. For example, the absolute configuration data associated with volume may specify that the volume is to be set to provide a particular root mean square (RMS) peak power to a speaker. In another example, absolute configuration data may specify that a particular make and model of controller is to be selected for use as an input device.

In comparison, relative configuration data is meaningful with respect to some other value. The relative configuration data may be expressed as percentages, ratios, quantity to be added to another quantity, and so forth. For example, the relative configuration data may specify increasing volume by 10% relative to a current volume setting of the media device.

The presentation profile may be updated by subsequent changes made by users during presentation of the content on recipient media devices. For example, the recipient media device may generate usage data which indicates a deviation from the presentation profile, changes to configuration settings not previously defined in the presentation profile, and so forth. This usage data may then be processed and used to refine or otherwise change the presentation profile.

By utilizing the system and techniques described in this disclosure, the content consumption experience may be improved for subsequent users of content. Content may be presented to the users, and changes to the configuration settings may be applied automatically. This may also reduce the incidence of the user making manual changes. As a result, the user may be less distracted and remain engaged with the content.

Illustrative System

FIG. 1 is a system 100 for generating a presentation profile based on usage data obtained from a plurality of media devices. One or more users 102(1), 102(2), . . . , 102(U) may use one or more media devices 104(1), 104(2), . . . , 104(D). As used in this disclosure, letters in parenthesis such as "(D)" indicate an integer value. The media devices 104 may include televisions, tablet computers, personal computers, electronic book readers, gaming consoles, set-top boxes, media players, in-vehicle entertainment systems, portable media players, smartphones, servers, and so forth.

Some media devices 104 may include output devices configured to render output which is perceptible to the user 102, such as display screens which produce images, speakers which produce audible sounds, and so forth. Other media devices 104 may rely on external output devices (or other media device 104) to provide output to the users 102. For example, a set-top-box media device 104(1) may connect to a television media device 104(2) and use the television to present images.

Some media devices 104 may also include controls which allow the user 102 to make changes to configuration. For example, the television media device 104(2) may have controls to change video settings and volume, while an audio/video receiver (AVR) media device 104(3) may have volume controls and audio effects settings. In comparison, the STB media device 104(1) may not have a volume control.

One or more controllers 106 may be in communication with one or more of the media devices 104 to provide input. The controllers 106 may include physical remote controls such as game controllers, mice, keyboards, or virtual remotes. The virtual remotes may comprise software which executing on a device such as a smartphone or tablet, and so forth. The controllers 106 may communicate with the media device 104 using acoustic, optical, radio frequency (RF), or other signals. The controller 106 is configured to accept user input from the user 102 and provide information indicative of this input to one or more of the media devices 104. For example, the controller 106 may comprise a game controller having various buttons, joysticks, and so forth suitable for playing game applications. In some implementations the controllers 106 may include output devices, such as lights, displays, speakers, haptic output devices, and so forth.

The media device 104 may include an operating system (OS) module 108 configured to accept input from input devices and provide the input to other modules executing on one or more hardware processors of the media device 104. The OS module 108 may provide other services as well.

A presentation module 110 is configured to present or provide access to some content 112. The content 112 may include applications (apps), music, movies, television, audiobooks, electronic books (eBooks), documents, and so forth. The application content 112 may provide various functionalities such as games, word processing, photo manipulation, and so forth. The content 112 may be stored locally in memory of the media device 104, or may be retrieved from another device, such as streamed from a server. The presentation module 110 may be configured to render incoming content 112 into a format which is suitable for presentation on one or more output devices. For example, the presentation module 110 may be configured to establish an encrypted connection with a content streaming server, receive and decrypt the stream, and render output to a high definition multimedia interface (HDMI) port or a display device.

The OS module 108, the presentation module 110, or other modules may be configured to accept input from the user 102 by way of one or more input devices. The input may be used to configure one or more of the modules. For example, the OS module 108 may receive from a controller 106 user input indicating a volume change command has been entered. The OS module 108 may respond to this command by changing the amplification level of an audio amplifier which is coupled to a speaker.

A data acquisition module 114 is configured to acquire usage data 116 associated with operation of the media device 104. In some implementations the data acquisition module 114 may operate as a service of the OS module 108. The data acquisition module 114 may process log data generated by operation of the OS module 108 or other modules, such as the presentation module 110. The usage data 116 may be used to generate one or more presentation profile(s) 118, as described below.

The usage data 116 comprises information which may be indicative of one or more of environment data 120, configuration data 122, and so forth. The usage data 116 may provide information about the state of the media device 104, the environment affecting the media device 104, how the user 102 is interacting with the content 112, and so forth. The environment data 120 provides information indicative of the content 112 being presented, what user 102 is logged into the media device 104, what devices are connected to the media device 104, ambient noise level around the media device 104, and so forth. The configuration data 122 provides information about settings made by the user 102 which are associated with presentation of the content 112. For example, the configuration data 122 may include volume level data which indicates a change in volume. The configuration data 122 may also include information indicative of a position within the content 112 where the setting changes were made. Continuing the example, the position may indicate a time index or frame number within the content 112 at which the volume level was changed. The usage data 116 is described in more detail in this disclosure, in particular with regard to FIG. 2.

The media device 104 may receive one or more presentation profiles 118. As described elsewhere in this disclosure, the presentation profiles 118 may be generated based on usage data 116 acquired from a plurality of users 102 accessing the content 112 from a plurality of media device 104. The presentation profiles 118 provide information indicative of changes to be made to the configuration of the media device 104 which are associated with presentation of the content 112.

The presentation profiles 118 may be specific to a particular piece of content 112, such as a particular movie or game. For example, the presentation profile 118 for the movie "Short Circuit" may indicate at time index 01:03:12 volume level is to be increased by 10% above a origin value, while at time index 01:27:09 the volume level is to be decreased to 6% below the origin value. The origin value may be the default volume level, such as set by the user 102. Continuing this example, during presentation of content 112 which has a corresponding presentation profile 118, the user 102 experiences automatic adjustments to volume which are based on the volume changes made by other users 102 who watched the same content 112. However, should the user 102 of the recipient media device 104 choose to, the settings provided by the presentation profile 118 may be overridden.

The presentation profiles 118 may be associated with particular content categories, content genres, and so forth. For example, a particular piece of content 112 may be assigned a category such as "game", "movie", "music", and so forth. A presentation profile 118 may be available for one or more of these categories.

The presentation profiles 118 may also be specific to the environment as expressed by the environment data 120. For example, the movie "Short Circuit" may have a first presentation profile 118(1) associated with an environment where the user 102 is listening with headphones and a second presentation profile 118(2) which is associated with presentation in a home theater AVR with multiple sound channels. As the environment changes, the presentation module 110 may apply different presentation profiles 118. For example, as the user 102 begins watching the movie with headphones, and then connects the media device 104 to the home theater AVR, the appropriate presentation profile 118 may be selected and used.

In some implementations, the presentation module 110 may select the particular presentation profile 118 based on a hierarchy. For example, a presentation profile 118 which is specific to the content 112 title and current environment of the media device 104 which is presenting the content 112 may be selected rather than a more generic presentation profile 118 for the content category of "movie".

The media devices 104 may couple to one or more networks 124. The networks 124 may be personal area networks (PANs), local area networks (LANs), wide area networks (WANs), and so forth. The WAN may include private networks, public networks such as the Internet, or a combination thereof. Connections may be established between media devices 104 which are on the same or different LANs or WANs or using different technologies. For example, media devices 104(1) and 104(6) may connect to one another using Wi-Fi, while the media device 104(2) and 104(5) may be interconnected using Bluetooth. The media devices 104 may connect wired or wirelessly to the networks 124.

Also connected to the networks 124 are one or more servers 126. The servers 126 may comprise one or more pieces of physical hardware, and may be present at a single physical location or distributed across multiple locations. For example, the servers 126 may reside at multiple datacenters in different cities, and may execute virtual machines on hardware processors spanning multiple pieces of physical hardware. The servers 126 may thus operate in, or provide, a distributed computing environment upon which one or more of the following functions may be provided.

A content distribution module 128 is configured to distribute content 112, or portions thereof, to the media devices 104. In some implementations the content distribution module 128 may send content 112, or may provide license keys and network addresses associated with obtaining and accessing the content 112. The distribution of content 112 may include file transfers, streaming, setup and usage of encrypted communication pathways, exchange of cryptographic keys, and so forth. The content distribution module 128 may utilize or operate in conjunction with content delivery networks or other systems to enable the media device 104 to present the content 112.

The servers 126 may provide a profile generation module 130. The profile generation module 130 is configured to receive the usage data 116 from a plurality of source media devices 104 and generate the presentation profiles 118. The profile generation module 130 may thus be configured to support "crowdsourcing" to generate the presentation profiles 118.

The profile generation module 130 may apply one or more statistical or mathematical operations to the usage data 116 to generate the presentation profiles 118. For example, a regression analysis may be used to analyze the volume level data obtained from configuration data 122 of hundreds of users 102 consuming the same content 112. Other techniques may also be used, such as designating and discarding outlier values, calculating an average of the values, calculating a minimum of the values, calculating a maximum of the values, calculating a mode of the values, and so forth. While depicted as executing on the server 126 in this illustration, in other implementations the profile generation module 130 may execute locally on the media device 104. In this local mode, the profile generation module 130 may receive usage data 116 from other media devices 104, or analyze usage data 116 generated locally by the media device 104 upon which the profile generation module 130 is executing.

The profile generation module 130 may select a particular presentation profile 118 by way of a recommendation engine using data such as content 112 previously consumed by the user 102, demographics, usage patterns, type of media device 104, environment data 120 such as attached devices, and so forth as input to select one or more presentation profiles 118 for the user 102. For example, the profile generation module 130 may use the environment data 120 indicating that the media device 104 is a tablet device to which headphones are connected and is in use by a user between the ages of 18 and 24 to select presentation profile 118(1) for use.

Once produced by the profile generation module 130, the presentation profiles 118 may be distributed to the recipient media devices 104. In some implementations the same media device 104 may be both a source for usage data 116 and may also receive presentation profiles 118 based on that usage data 116. Similarly, the profile generation module 130 may receive usage data 116 indicating the user's 102 interaction with a previously distributed presentation profile 118. The usage data 116 indicating how the user 102 overrode the presentation profile 118 may then be used by the profile generation module 130 to refine or adjust the presentation profile 118 for subsequent distribution.

The source media devices 104 which generate the usage data 116 and the recipient media devices 104 which use the presentation profiles 118 may differ. For example, the source media devices 104 may include television media devices 104(2) with built-in volume controls, tablet media devices 104(4), and so forth while the recipient media devices 104 may include a STB media device 104(3). The presentation profile 118 may thus allow information gained during presentation of content 112 on one type of media device 104 to be used on another type of media device 104. Thus, the volume changes resulting from the user 102 manipulating volume controls on the tablet media device 104(4) may be used to automatically adjust volume on the STB media device 104(1) which may lack volume controls.

In some implementations a presentation profile 118 may be manually generated. For example, a content developer 132 may use a content editing system 134 to manually create a presentation profile 118, or to manually modify an existing presentation profile 118. Continuing the example, in post-production a studio may generate presentation profiles 118 which are tailored to particular environments of the media device 104.

Prior to distribution to the media device 104, the presentation profiles 118 may be used to modify the content 112 or create a version of the content 112. For example, different versions of audio data in the content 112 may be generated using the presentation profile 118. In this example, the modified content 112 may be provided instead of, or in addition to, the presentation profile 118.

Figure 2:
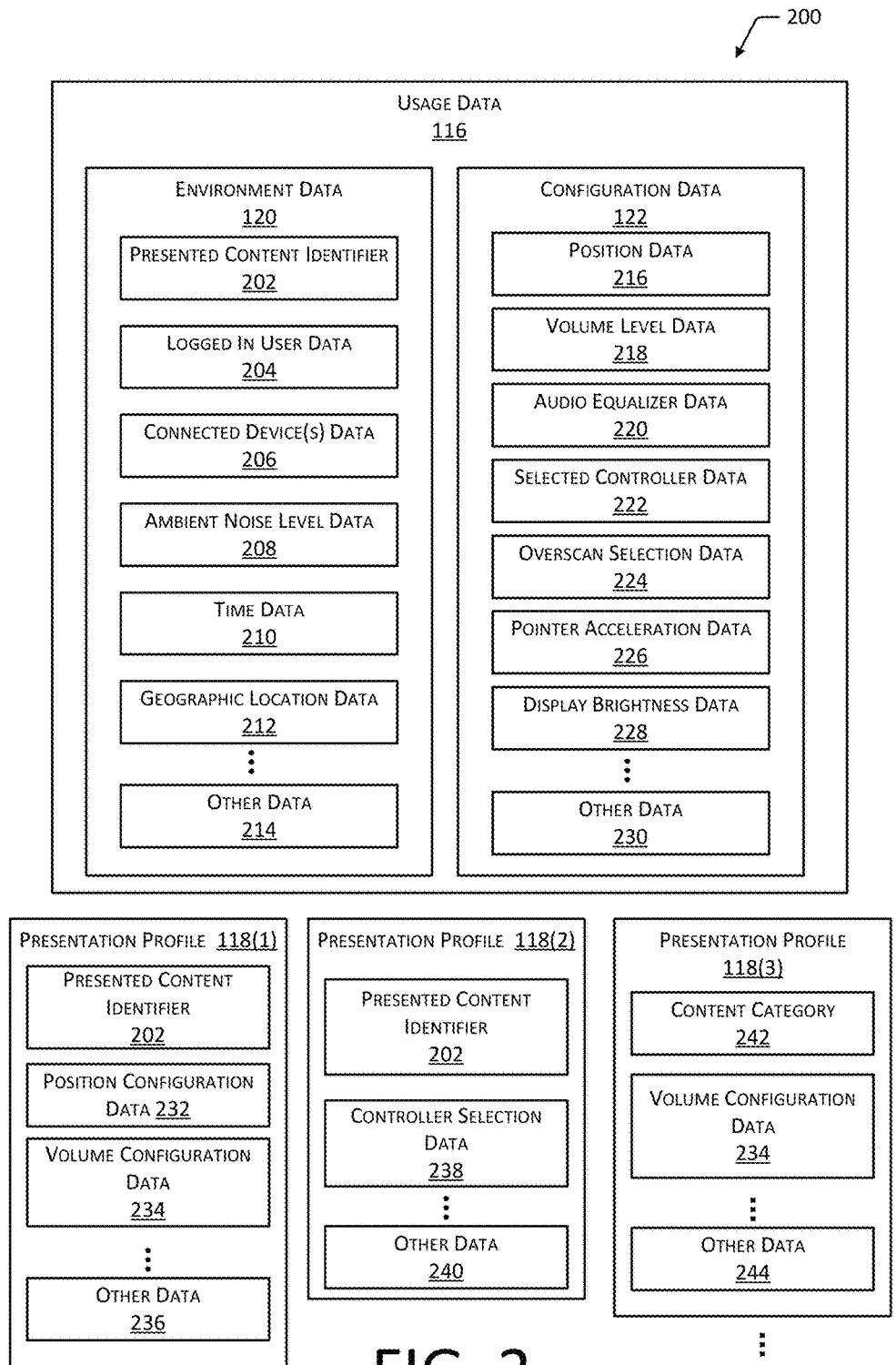
FIG. 2 is a block diagram of presentation profiles and usage data including environment data and configuration data.

FIG. 2 is a block diagram 200 of presentation profiles 118 and usage data 116 including environment data 120 and configuration data 122. As described above, the usage data 116 may include environment data 120 and configuration data 122. The media device 104 may generate usage data 116 which includes the environment data 120, the configuration data 122, or both. The usage data 116 may be provided to the profile generation module 130 for use in generating the presentation profiles 118.

The environment data 120 provides information indicative of the environment in which the media device 104 is operating. The environment data 120 comprises information about the media device 104 which may be subject to change due to an action of the user 102, but is not directly configurable by the user 102. For example, the user 102 may change the physical location of the media device 104 by carrying it from one place to another, but the user 102 is not able to directly modify data on the media device 104 which is indicative of latitude and longitude. The environment data 120 may include a presented content identifier 202, logged in user data 204, connected device data 206, ambient noise level data 208, time data 210, and geographic location data 212, or other data 214.

The presented content identifier 202 may comprise a unique identifier which refers to particular content 112. For example, a "director's cut" version of the movie "Short Circuit" may have the presented content identifier 202 of "0x6e0x650x770x740x6f0x6e".

The logged in user data 204 provides information indicative of a user account which is associated with activities on the media device 104. For example, the logged in user data 204 may indicate that the user 102(1) is signed into the tablet media device 104(4).

The connected device data 206 provides information indicative of what other output devices, media devices 104, or both, are connected to the media device 104. For example, the connected device data 206 may indicate a pair of headphones is plugged into a headphone jack, or a Bluetooth speaker is configured to present audio output, an HDMI cable is connected to a display device, and so forth.

The ambient noise level data 208 provides information about sound levels around the media device 104 such as a microphone coupled to the media device 104 or in the environment of the media device 104. For example, the ambient noise level data 208 may comprise periodic sampling of audio signals acquired from a microphone in a remote control of the media device 104 to determine noise level, type of noise (speech, machine noise, wind, and so forth), and so forth. In another example, the ambient noise level data 208 may be acquired from microphones on the tablet media device 104(4), or other microphones which are accessible by way of the one or more networks 124 and in the environment associated with presentation of the content 112. In some implementations the acquisition of ambient noise level data 208 may be responsive to a change in the configuration data 122. For example, user input to change volume level may initiate acquisition of the ambient noise level data 208.

The time data 210 provides information associated with a time of presentation, including but not limited to time of day, date, day of week, and so forth. The time data 210 may be used in conjunction with other environment data 120 to determine particular habits or patterns of behavior.

The geographic location data 212 may include information such as a latitude and longitude, street address, ZIP Code, and so forth. The geographic location data 212 may be used to determine when the user 102 is at home, at work, on a bus, and so forth.

Other data 214 may also be acquired and provided in the environment data 120. For example, the other data 214 may include an indication of a number of users proximate to the media device 104, ambient temperature data such as provided by a thermometer, light levels as detected by a light sensor or camera, and so forth.

The usage data 116 may also include configuration data 122. The configuration data 122 indicates a state, level, or setting of one or more parameters which are configurable by the user 102, or which result from input provided by the user 102. In comparison to the environment data 120, the configuration data 122 may be changed by the user 102. The configuration data 122 may include position data 216, volume level data 218, audio equalizer data 220, selected controller data 222, overscan selection data 224, pointer acceleration data 226, display brightness data 228, or other data 230.

The position data 216 provides information indicative of a particular point or section of the content 112. The position data 216 may be represented by one or more of a time index, frame number, scene indicator, game level, byte count, and so forth. For example, where the content 112 comprises a game, the position data 216 may indicate a portion of the game which is presented to a user 102 after completing a first achievement within the game and before completion of a second achievement. In some implementations, the position data 216 may indicate that the configuration data 122 is applicable to the entire piece of content 112. In other implementations, position data 216 may be used to reflect points within the content 112 at which a configuration affecting presentation was changed.

The volume level data 218 provides information indicative of a volume setting associated with the media device 104. The volume level data 218 may be expressed as an absolute value, relative value, percentage, ratio, and so forth. For example, the volume level data 218 may indicate an absolute value in terms of decibels (dB) with reference to a pressure of 20 micropascals in air. In another example, the relative value may comprise an indication of the volume setting is at 25 out of the maximum of 50 otherwise dimensionless units, at 47% of maximum, and so forth. In some implementations, the volume level data 218 may be expressed as a delta or differential relative to previous state. For example, the volume level data 218 may indicate that the volume level was decreased by 10% from a previous value, or the volume level was decreased by 10% relative to an origin value.

The audio equalizer data 220 may provide information indicative of amplification or attenuation applied to one or more frequency bands, such as used in a graphic equalizer. For example, the audio equalizer data 220 may indicate that the user 102 is configured the media device 104 to amplify by 3 dB sounds having a frequency in the range from 10 kHz to 12 kHz.

The selected controller data 222 provides information indicative of a particular controller 106, the group of controllers 106, or category or type of controller 106 which is been selected for use with the content 112. For example, the selected controller data 222 may indicate that the user 102 has manually selected the game controller 106(2) for use with the game content 112 titled "Cat Chase". When used in conjunction with the position data 216, the configuration data 122 may provide usage data 116 which indicates the user 102 has changed between different controllers 106 at different points during presentation of the content 112. For example, the user 102 may use a tablet media device 104(4) as a virtual remote control to accept touch input during a first level of the game, and the transition to use the game controller 106(2) to provide input during a second level of the game. Thus, different controllers 106 may be selected for use at different points during consumption of the content 112.

The overscan selection data 224 may indicate whether to use an overscan of the image. In some implementations, video data may include rows, columns, or both which extend around a perimeter of the image. Within the perimeter, data may be encoded in an analog form, such as analog closed captioning data represented by activation of particular pixels within the perimeter. The overscan selection data 224 may indicate whether the user 102 has manually indicated that content 112 should be overscan, and thus have the perimeter cropped from the visible image as presented on the display device.

The pointer acceleration data 226 provides a value indicative of acceleration applied to cursor movement. The pointer acceleration data 226 may be applied to pointer input such as that from a mouse or touch sensor. For example, a high acceleration value configures the OS module 108 to translate a small movement of a mouse into a large movement of a cursor across the display device.

The display brightness data 228 provides information indicative of the intensity of light emitted from the display device. For example, the display brightness data 228 may indicate an intensity of a backlight of a liquid crystal display, intensity of a front light illuminating electrophoretic display, intensity at which individual light emitting pixels operate, and so forth.

Other data 230 may also be included in the usage data 116. For example, the other data 230 may include gamma or contrast settings associated with images presented on a display device, haptic output device settings, and so forth.

The values of the configuration data 122 may be expressed as absolute values, relative values, percentages, ratios, and so forth. In some implementations, the values may be reported as a change relative to a previous value, origin value, and so forth.

Also depicted in this figure are several block diagrams of different presentation profiles 118. The presentation profiles 118 are depicted here by way of illustration and not necessarily as a limitation.

A first presentation profile 118(1) includes the presented content identifier 202, position configuration data 232, and volume configuration data 234. The presented content identifier 202 as described above identifies a particular content 112. The position configuration data 232 indicates the position within the content 112 at which a change in the configuration is associated. For example, the position configuration data 232 may indicate a particular time index or frame number. The volume configuration data 234 comprises data indicative of a change to be applied to the volume level of the recipient media device 104. The volume configuration data 234 may be expressed as an absolute or relative value. For example, the volume configuration data 234 may indicate a relative volume change such that the current volume level of the media device 104 is reduced by 6%. This first presentation profile 118(1) is thus configured to automatically adjust volume settings on the recipient media device 104 at one or more points during presentation of the content 112. The first presentation profile 118(1) may include other data 236 as well.

In comparison, a second presentation profile 118(2) includes the presented content identifier 202 and controller selection data 238. As described above, the presented content identifier 202 identifies the particular content 112, such as a certain game. The controller selection data 238 indicates a particular controller 106, type of controller 106, make and model of controller 106, and so forth. In this illustration, the second presentation profile 118(2) omits position configuration data 232 and thus may be deemed to apply to the content 112 identified by the presented content identifier 202 at all positions. The second presentation profile 118(2) may include other data 240 as well.

A third presentation profile 118(3) is associated with a content category 242. As described above, in some implementations content 112 may be categorized into content categories 242. For example, the content categories 242 may include "game", "movie", or "music". In this illustration, the third presentation profile 118(3) may be used to adjust configuration for content 112 which is within the specified content category 242. In this example, the third presentation profile 118(3) may be associated with a category of "game" and may specify volume configuration data 234. As above, given that no position configuration data 232 is provided, the volume configuration data 234 may be deemed to apply to the entire presentation of content 112. The third presentation profile 118(3) may include other data 244 as well.

In some implementations, presentation profiles 118 may be associated with one or more conditions in the environment of the media device 104. For example, particular presentation profiles 118 may be designated for use when particular environment data 120 are present, such as during particular hours of a day, when the ambient noise level is above a threshold value, and so forth.

Figure 3:
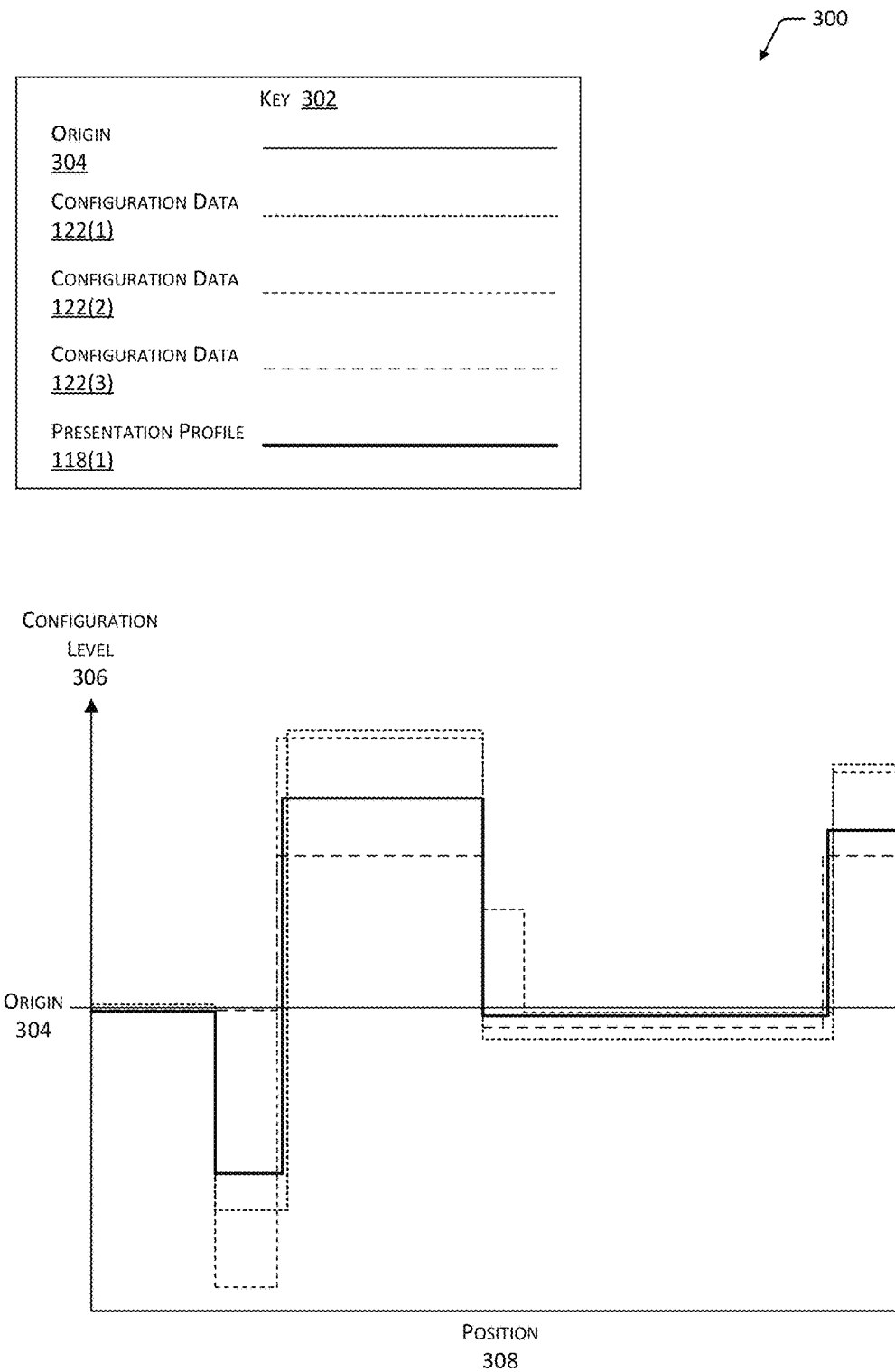
FIG. 3 illustrates information generated from usage data associated with particular content and a presentation profile for that particular content which is generated from the usage data.

FIG. 3 illustrates information 300 generated from usage data 116 associated with particular content 112 and a presentation profile 118 for that particular content 112 which is generated from the usage data 116. In this illustration a key 302 is depicted along with an associated graph. The graph indicates an origin 304, a configuration level 306 along a vertical axis, and a position 308 along a horizontal axis.

The origin 304 indicates a starting value or initial state for the configuration setting of the media device 104. For example, the configuration level 306 may be indicative of volume level data 218 and the origin 304 may indicate a default volume level as set by the OS module 108, or previously set by the user 102.

The position 308 is indicative of the position of the presentation in the content 112. The position 308 may correspond to the position data 216. For example, the position 308 may reference a time index, frame number, scene indicator, and so forth.

In this illustration, configuration data 122(1)-(3) has been acquired from three media devices 104, three users 102 each independently accessing the content 112 on the same media device 104, or combinations thereof. The configuration data 122(1)-(3) has been plotted here indicating how different users 102 have modified the configuration level 306 as presentation of the content 112 has progressed. As illustrated by the graph, different users 102 have different preferences as to particular settings of the configuration level 306. For example different users 102 at different levels of hearing acuity may increase or decrease the volume to different degrees. However, the configuration data 122 does indicate there are particular positions within the content 112 at which several users 102 are modifying the configuration level 306 of their respective media devices 104. Continuing the example where the configuration level 306 is indicative of the volume level, at different positions 308 within the content 112 the users 102 have decreased or increased the volume level on their respective media devices 104.

The configuration data 122 may be normalized to allow for comparison between different types of media devices 104, or from users 102, and so forth. The profile generation module 130 may be configured to use the configuration data 122 either as provided by the media devices 104, or as normalized. The presentation profile 118 may be generated by processing the configuration data 122. For example, the presentation profile 118(1) depicted in this figure has been generated by averaging the configuration levels 306 in the configuration data 122(1)-(3). In other implementations other analytical techniques may be used.

The presentation profile 118 may be encoded in a variety of data formats and data structures. For example, the presentation profile 118 may be expressed as a Fourier series, a series of positions 308 having respective changes to the configuration level 306, and so forth.

Figure 4:
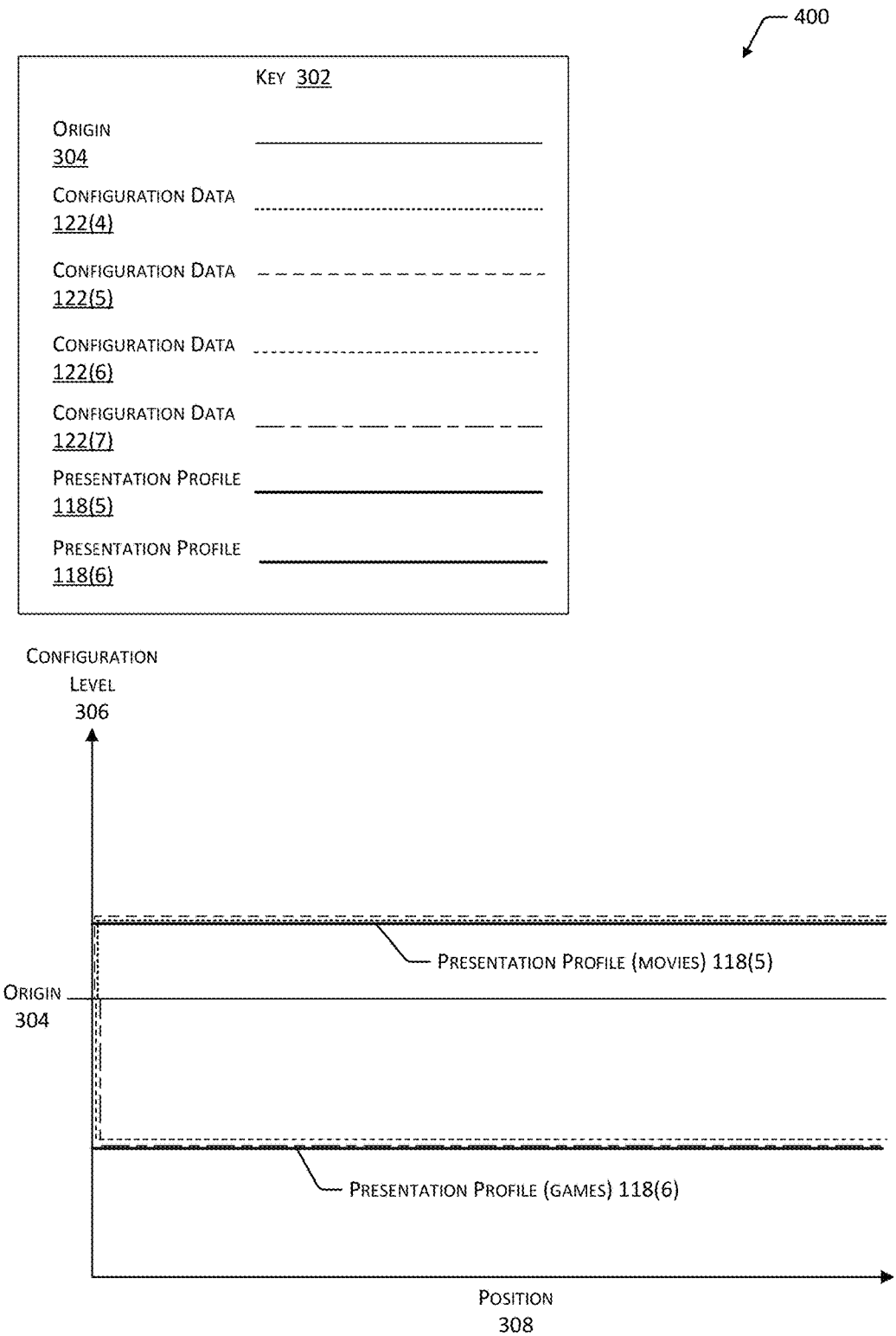
FIG. 4 illustrates another example of information generated from usage data from two categories of content and presentation profiles for each of those categories.

FIG. 4 illustrates another example of information 400 generated from usage data 116 from two categories of content 112 and presentation profiles 118 for each of those categories. As described elsewhere, presentation profiles 118 may be associated with particular content categories 242. In this illustration, the graph depicts presentation profile 118(5) which is associated with the content category of "movie" and presentation profile 118(6) which is associated with the content category of "game".

As illustrated here, the configuration data 122 indicates that after starting the presentation of the respective pieces of content 112, users 102 have adjusted the configuration level 306. For example, the configuration level 306 may be indicative of a volume level, and the users 102 which generated the configuration data 122 may have found that the content 112 with the category of "game" are typically too loud and thus lower the volume, while the content 112 with the category of "movie" are typically too quiet and thus may have raised the volume.

These presentation profiles 118(5) and 118(6) may be provided to the recipient media device 104, such as the STB media device 104(1). The recipient media device 104 may then, absent a content specific presentation profile 118, use these profiles to automatically adjust configuration levels 306. Continuing the example above, the user 102 may avoid being overwhelmed by loud volume from games and may avoid missing dialogue due to quiet audio while playing movies.

Figure 5:
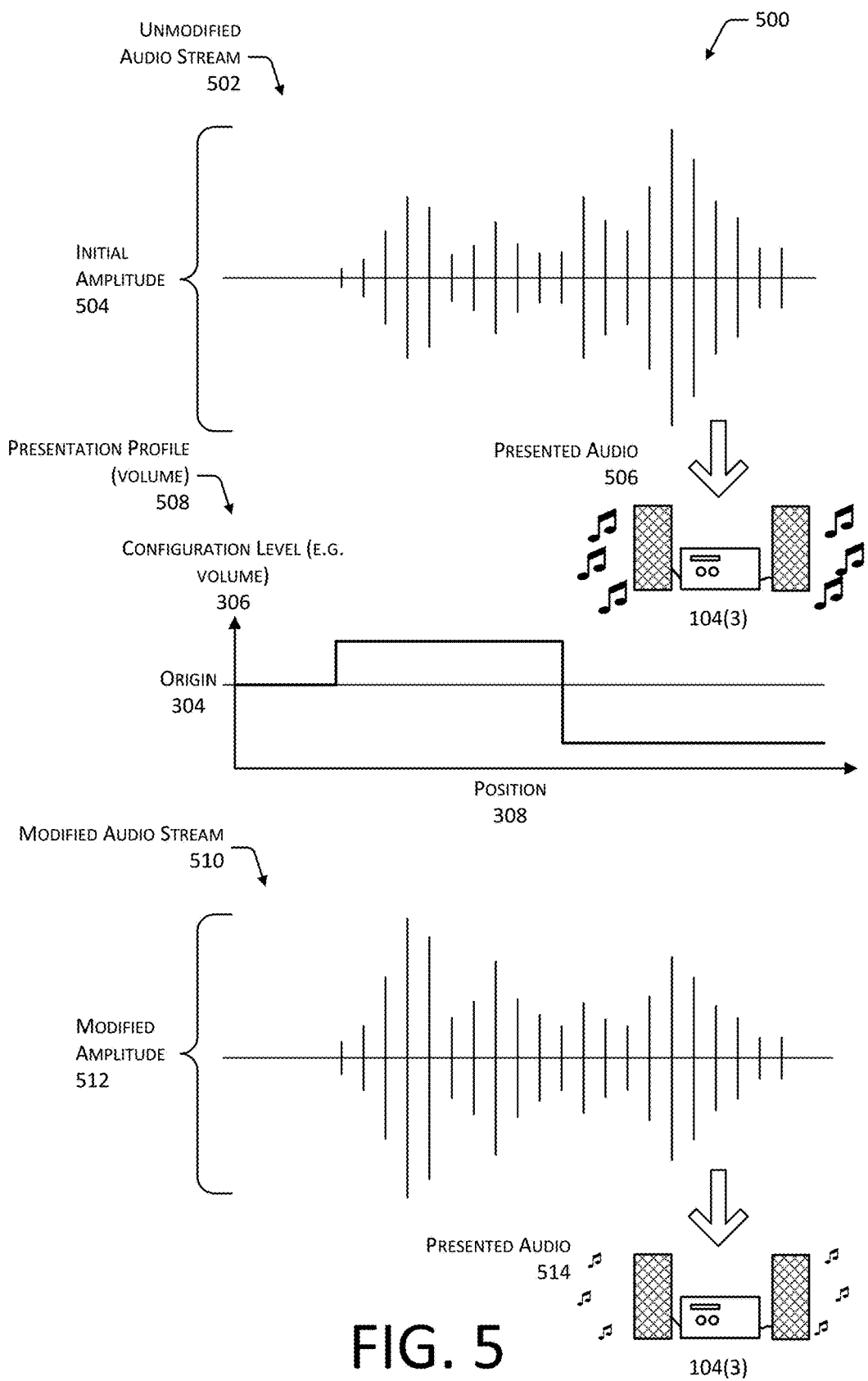
FIG. 5 illustrates modification of an audio stream using a presentation profile.

FIG. 5 illustrates modification 500 of an audio stream using a presentation profile 118. As described above, the presentation profile 118 may be used to change one or more of the configuration settings of the media device 104. In this illustration, the presentation profile 118 includes volume configuration data 234 which is used to modify the volume level data 218. In other implementations, the presentation profile 118 may change other configuration settings of the recipient media device 104 before or during presentation of the content 112.

In this illustration an unmodified audio stream 502 is depicted as a waveform. The audio stream comprises data which is configured to be processed and rendered as audible sound. For example, the audio stream may be expressed as pulse code modulated audio (PCM), or in another format. The audio stream may comprise digital data which indicates an amplitude and a frequency. The audio stream may be processed by a digital to analog converter to reproduce an analog signal. The analog signal may then be passed to an audio amplifier for amplification sufficient to operate a speaker and generate audible output.

The waveform exhibits an initial amplitude 504. The unmodified audio stream 502 may be sent to an output device such as the AVR media device 104(3). The output device processes the unmodified audio stream 502 and generates presented audio 506. As illustrated here, the unmodified audio stream 502 having initial amplitude 504 produces presented audio 506 which is relatively loud.

A presentation profile 508 is depicted here which is specific to the content 112 which is associated with the unmodified audio stream 502. The presentation profile 508 is configured to adjust a volume level as produced by the media device 104. The volume adjustment may occur prior to transmission of the audio stream to the output device.

A modified audio stream 510 depicts the waveform of the unmodified audio stream 502 as changed by applying information in the presentation profile 508. For example, the modification may include adding or subtracting values to or from amplitude information present in the unmodified audio stream 502. A modified amplitude 512 shows a first portion of the waveform has an amplitude which is greater than the initial amplitude 504, while a second portion of the waveform has an amplitude which is less than the initial amplitude 504. The modified audio stream 510 may be sent to the output device such as the AVR media device 104(3). As illustrated here, because the amplitude levels of the modified audio stream 510 have been changed, the presented audio 514 may be relatively quieter than the presented audio 506. The level of amplification applied by the output device such as the AVR may remain unchanged. Thus, the amplitude of the waveform expressed in the modified audio stream 510 is changed instead of varying the amplification provided by an output device such as the AVR media device 104(3).

By using the modified audio stream 510 for presentation of the content 112, the user 102 of the recipient media device 104 may experience a more pleasant user experience. Instead of manually adjusting the volume (or level of amplification) on the AVR media device 104(3), the user 102 is able to experience the content 112 without distraction. However, the user 102 may still be able to adjust one or more of the level of modification of amplitude of the modified audio stream 510 or the level of amplification by the AVR media device 104(3) (or other output device) to provide a particular presentation experience.

Figure 6:
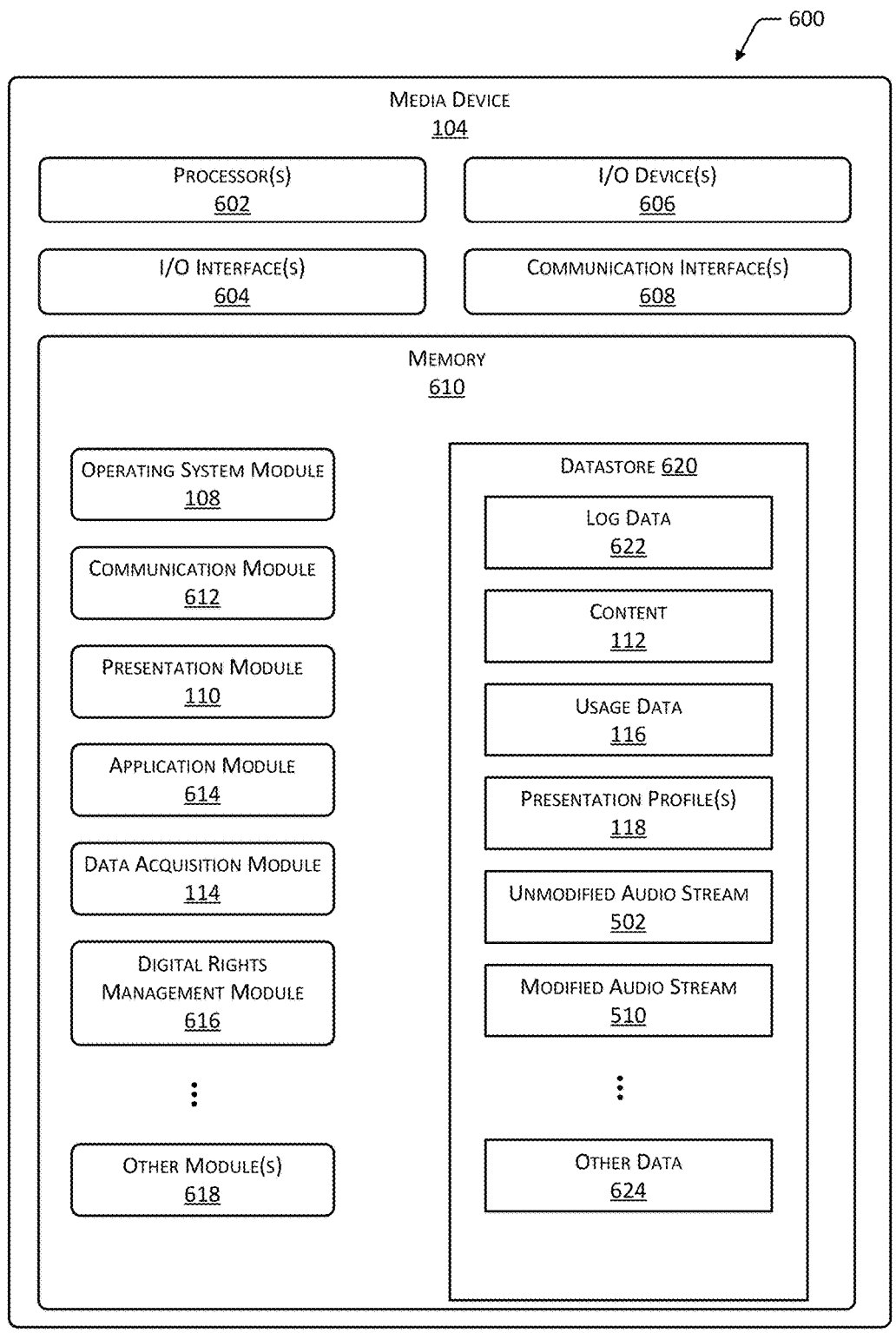
FIG. 6 illustrates a block diagram of a media device.

FIG. 6 illustrates a block diagram 600 of the media device 104. The media device 104 may include one or more hardware processors 602 (processors) configured to execute one or more stored instructions. The processors 602 may comprise one or more cores. The media device 104 may include one or more input/output (I/O) interface(s) 604 to allow the processor 602 or other portions of the media device 104 to communicate with other devices. The I/O interfaces 604 may comprise inter-integrated circuit (I2C), serial peripheral interface bus (SPI), Universal Serial Bus (USB) as promulgated by the USB Implementers Forum, RS-232, one or more media device interfaces such as High Definition Multimedia Interface (HDMI) as promulgated by HDMI Licensing LLC, TOSLINK as promulgated by Toshiba Corp., analog video, analog audio, IEEE 6394 as promulgated by the Institute for Electrical and Electronics Engineers, and so forth.

The I/O interface(s) 604 may couple to one or more I/O devices 606. The I/O devices 606 may include input devices such as one or more of a camera, a microphone, a touch sensor, a button, range camera, accelerometer, gyroscope, magnetometer, tilt sensor, and so forth. The I/O devices 606 may also include output devices such as one or more of a display, audio speakers, haptic output devices, and so forth. In some embodiments, the I/O devices 606 may be physically incorporated with the media device 104 or may be externally placed.

The media device 104 may also include one or more communication interfaces 608. The communication interfaces 608 are configured to provide communications between the media device 104 and other devices, such as other media devices 104, routers, access points, the servers 126, and so forth. The communication interfaces 608 may be configurable to couple to PANs, LANs, WANs, and so forth. For example, the communications interfaces 608 may enable connectivity to Ethernet, Wi-Fi Bluetooth, ZigBee, and so forth.

The media device 104 may also include one or more busses or other internal communications hardware or software that allow for the transfer of data between the various modules and components of the media device 104.

As shown in FIG. 6, the media device 104 includes one or more memories 610. The memory 610 comprises one or more computer-readable storage media (CRSM). The CRSM may be any one or more of an electronic storage medium, a magnetic storage medium, an optical storage medium, a quantum storage medium, a mechanical computer storage medium, and so forth. The memory 610 provides storage of computer readable instructions, data structures, program modules, and other data for the operation of the media device 104.

The memory 610 may include at least one OS module 108. The OS module 108 is configured to manage hardware resource devices such as the I/O interfaces 604, the I/O devices 606, the communication interfaces 608, and provide various services to applications or modules executing on the processors 602. The OS module 108 may implement a variation of the Linux operating system, such as Android as promulgated by Google, Inc. Other OS modules 108 may be used, such as the iOS operating system from Apple, Inc. of Cupertino, Calif., the Windows operating system from the Microsoft Corporation of Redmond, Wash., the LynxOS from LynuxWorks of San Jose, Calif., the FreeBSD operating system and variants, and so forth.

Also stored in the memory 610 may be one or more of the following modules. These modules may be executed as foreground applications, background tasks, daemons, and so forth.

A communication module 612 is configured to establish communications with one or more of the media devices 104, other servers 126, or other devices. In some implementations the communication module 612 may implement a transmission control protocol/Internet protocol (TCP/IP) stack. The communication module 612 may be configured to provide transport layer security, secure socket layer transmission, and so forth.

The presentation module 110 may also be stored in the memory 610. As described above, the presentation module 110 is configured to present or provide access to some types of content 112. The presentation module 110 may be used to render music, movies, television, audiobooks, eBooks, documents, and so forth into a format which is suitable for presentation on one or more output devices. For example, the presentation module 110 may be configured to decrypt streamed video content 112 and render output to an HDMI port or the display device.

In some implementations the content 112 may include application modules 614. The application modules 614 provide functionality which is interactive with, or provides information to, the user 102. In some implementations the content 112 may comprise one or more application modules 614. For example, the application module 614 may comprise a game, word processor, photo editor, and so forth which executes on the processor 602.

The data acquisition module 114 may also be stored in the memory 610 and may be configured to acquire usage data 116 associated with operation of the media device 104. In some implementations the data acquisition module 114 may operate as a service of the OS module 108. For example, the data acquisition module 114 may comprise a daemon which executes as part of the OS module 108 and retrieves information from log files generated during operation of the media device 104. The log data may be parsed to produce the usage data 116. In some implementations the data acquisition module 114 may actively pull other processes or hardware to determine state or configuration settings.

The memory 610 may also store a digital rights management (DRM) module 616. The DRM module 616 may be configured to maintain one or more digital rights associated with the content 112. For example, the DRM module 616 may restrict presentation of the content 112 to specific types of output devices, such as a built-in display. The DRM module 616 may operate in conjunction with, or as part of, the OS module 108, the communication module 612, the presentation module 110, the application module 614, or other modules.

Other module 618 may also be stored in the memory 610. For example a speech recognition module may be stored in the memory 610 and may be configured to process speech input from the user 102. The one or more processors 602 may execute the modules, including the application modules 614, at least in part. For example, a portion of the application module 614 may execute on the server 126 while a portion of the application module 614 executes on the processor 602.

The memory 610 may also include a datastore 620 to store information. The datastore 620 may use a flat file, database, linked list, tree, executable code, script, or other data structure to store the information. In some implementations, the datastore 620 or a portion of the datastore 620 may be distributed across one or more other devices including servers 126, other media devices 104, network attached storage devices, and so forth.

The datastore 620 may store log data 622. The log data 622 may comprise information resulting from operation of one or more processes or modules on the media device 104. For example, the log data 622 may include a log of user input events as entered by a controller 106 and received by the media device 104. The data acquisition module 114 may access the log data 622 to generate at least a portion of the usage data 116.

In some implementations the content 112 or portion thereof may be stored within the datastore 620. For example, a music file may be downloaded and stored in the datastore 620 for later presentation.

The usage data 116 may also be stored in the datastore 620. As described above, this may include environment data 120 and configuration data 122.

The presentation profiles 118 which have been received by the media device 104 may also be stored in the datastore 620 for subsequent use. For example, the presentation module 110 may access the presentation profile 118 associated with a particular piece of content 112 to modify presentation of that content 112. In another example, the OS module 108, the application module 614, or both, may access the presentation profile 118 to modify one or more settings associated with the application module 614.

In some implementations, the datastore 620 may store portions of the content 112 before, after, or before and after modification by application of the presentation profile 118. For example, the datastore 620 may include the unmodified audio stream 502 and the modified audio stream 510 as described with regard to FIG. 5.

The datastore 620 may store other data 624 as well, such as user preferences, configuration files, authentication credentials, and so forth.

Figure 7:
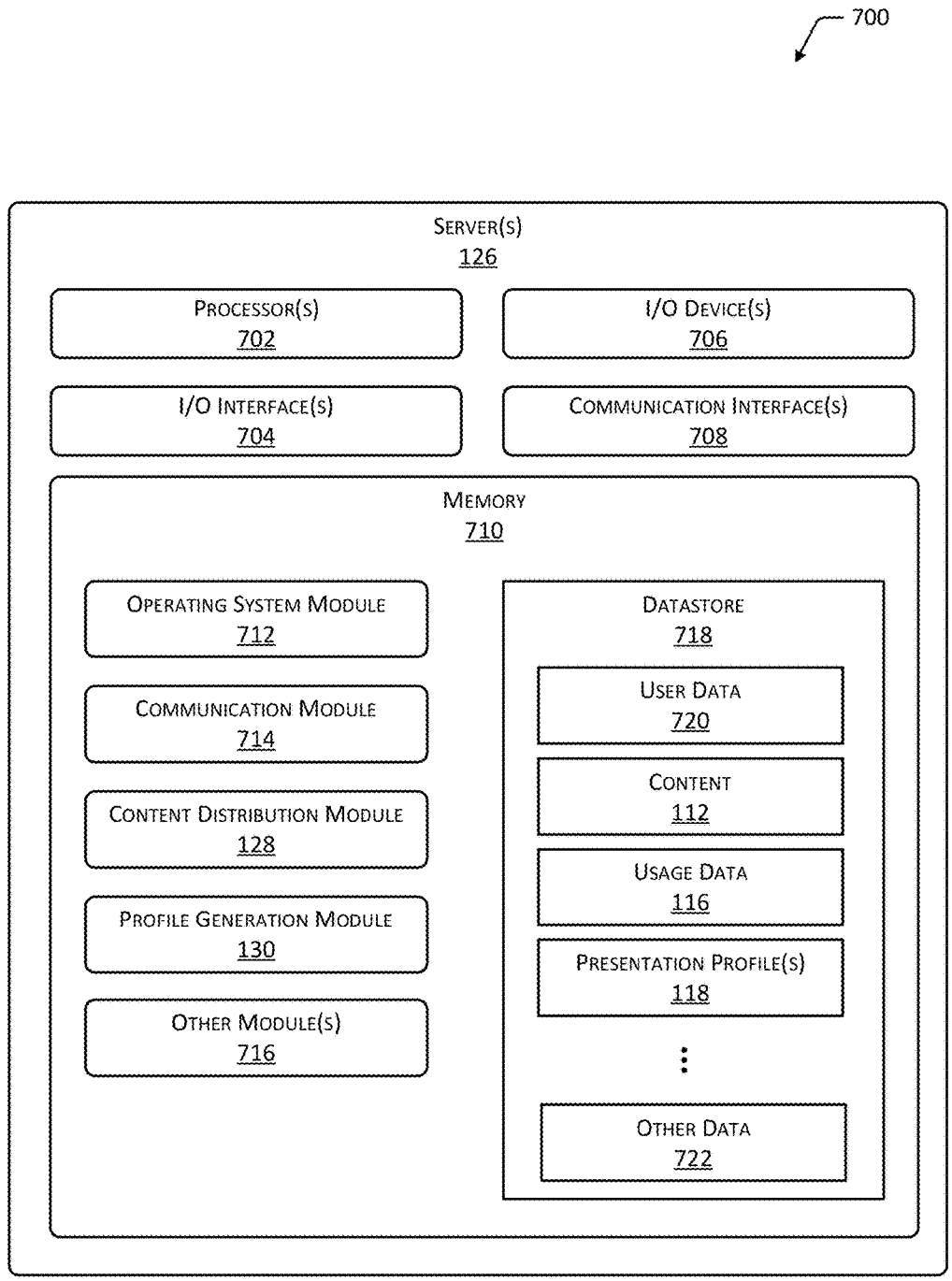
FIG. 7 illustrates a block diagram of a server which may generate the presentation profiles based on usage data from a plurality of media devices.

FIG. 7 illustrates a block diagram 700 of the server 126 which may generate the presentation profiles 118 based on usage data 116 from a plurality of media devices 104 or users 102 thereof. The functions provided by the server 126 may be distributed across one or more physical or virtual devices.

The server 126 may include one or more hardware processors 702 (processors) configured to execute one or more stored instructions. The processors 702 may comprise one or more cores. The server 126 may include one or more I/O interface(s) 704 to allow the processor 702 or other portions of the server 126 to communicate with other devices. The I/O interfaces 704 may comprise I2C, SPI, USB, RS-232, and so forth.

The I/O interface(s) 704 may couple to one or more I/O devices 706. The I/O devices 706 may include input devices such as one or more of a keyboard, mouse, scanner, and so forth. The I/O devices 706 may also include output devices such as one or more of a display, audio speakers, and so forth. In some embodiments, the I/O devices 706 may be physically incorporated with the media device 104 or may be externally placed.

The server 126 may also include one or more communication interfaces 708. The communication interfaces 708 are configured to provide communications between the server 126 and other devices, such as the media devices 104, routers, access points, and so forth. The communication interfaces 708 may include PANs, LANs, WANs, and so forth.

The server 126 may also include one or more busses or other internal communications hardware or software that allow for the transfer of data between the various modules and components of the server 126.

As shown in FIG. 7, the server 126 includes one or more memories 710. The memory 710 comprises one or more CRSM as described above. The memory 710 provides storage of computer readable instructions, data structures, program modules and other data for the operation of the media device 104.

The memory 710 may include at least one OS module 712. The OS module 712 is configured to manage hardware resource devices such as the I/O interfaces 704, the I/O devices 706, the communication interfaces 708, and provide various services to applications or modules executing on the processors 702. The OS module 712 may implement a variation of the Linux operating system as promulgated by Linus Torvalds, the FreeBSD operating system, the Windows Server operating system from the Microsoft Corporation of Redmond, Wash., and so forth.

Also stored in the memory 710 may be one or more of the following modules. These modules may be executed as foreground applications, background tasks, daemons, and so forth.

A communication module 714 is configured to establish communications with one or more of the media devices 104, other servers 126, or other devices. In some implementations the communication module 714 may implement a TCP/IP stack. The communication module 714 may be configured to provide transport layer security, secure socket layer transmission, and so forth.

The memory 710 may also store the content distribution module 128. The content distribution module 128 is configured to distribute content 112, or portions thereof, to the media devices 104. In some implementations the content distribution module 128 may send content 112, or may provide license keys and network addresses associated with obtaining and accessing the content 112. The distribution of content 112 may include file transfers, streaming, setup and usage of encrypted communication pathways, exchange of cryptographic keys, and so forth. The content distribution module 128 may utilize or operate in conjunction with content delivery networks or other systems to enable the media device 104 to present the content 112.

The profile generation module 130 may be stored within the memory 710. The profile generation module 130 is configured to access usage data 116 which has been received from one or more of the media devices 104. The usage data 116 may be representative of actions by one or more users 102 across the one or more media devices 104.

The profile generation module 130 may use a variety of techniques to generate the presentation profiles 118. For example, the usage data 116 may be parsed initially to remove outliers, discard input from particular users 102, discard input from particular media devices 104, and so forth. Continuing the example, input from particular users 102 such as children may be disregarded as being considered unreliable. The usage data 116 may also be filtered according to demographic to generate presentation profiles 118 which are targeted to particular demographic groups. For example, usage data 116 associated with use by minors may be used to generate presentation profiles 118 designed for facilitating presentation to minors. In another example, usage data 116 associated with presentation of content 112 to adults over 50 years of age may be used to generate presentation profiles 118 targeted to that particular demographic group.

The profile generation module 130 may assign different weights to usage data 116 acquired from different users 102 or media devices 104. For example, usage data 116 which results from users 102 who are designated as mavens or trustworthy resources may be assigned a higher weight than usage data 116 acquired from other users 102.

In addition to statistical or mathematical operations, the profile generation module 130 may use a variety of machine learning techniques including but not limited to Bayesian networks, genetic algorithms, neural networks, and so forth to process the usage data 116. For example, the usage data 116 may be combined with manually generated presentation profiles 118 to train a neural network to generate presentation profiles 118 without human intervention.

The profile generation module 130 may use a variety of techniques to validate or confirm that the presentation profiles 118 accurately reflect the desires of the users 102. For example, the profile generation module 130 may generate several different versions of the presentation profiles 118. Performance characteristics of each of these different versions may be assessed to determine which presentation profiles 118 were left unchanged, or which were overridden by the user 102 during presentation of the content 112. Those presentation profiles 118 which were overridden may be discarded while those which were left unchanged may be retained.

The profile generation module 130 may employ a recommendation engine to select the presentation profile 118 for distribution to the media device 104. The recommendation engine may use the usage data 116, information about the user 102 such as demographics, usage patterns, and so forth as input. The demographic information may include age, previous content consumption, content preferences, feedback provided on previous presentation profiles 118, and so forth. The recommendation may use techniques similar to, or the same as, those used to recommend content 112 to the user 102.

Other modules 716 may also be present in the memory 710. For example, a digital rights management module may provide support for delivering content 112 which is protected using one or more digital rights management schemes to the media devices 104.

The memory 710 may also include a datastore 718 to store information. The datastore 718 may use a flat file, database, linked list, tree, executable code, script, or other data structure to store the information. In some implementations, the datastore 718 or a portion of the datastore 718 may be distributed across one or more other devices including other servers 126, network attached storage devices, and so forth.

The datastore may include user data 720. The user data 720 may include information such as login credentials, demographic data, address information, content watch lists, and so forth. The user data 720 may be used by the profile generation module 130 to determine and generate the presentation profiles 118. For example, the user data 720 may be used to assign a demographic to the usage data 116 which is been received.

The server 126 may also store content 112 in the datastore 718. As described above, the content distribution module 128 provides the content 112 to the media devices 104. Also stored in the datastore 718 may be the usage data 116 as received from a plurality of media devices 104. The presentation profiles 118 which have been generated by the profile generation module 130 or received from the content editing system 134 may also be stored in the datastore 718. The datastore 718 may store other data 722 as well, such as account usage information, billing data, encryption credentials, and so forth.

Illustrative Processes

Figure 8:
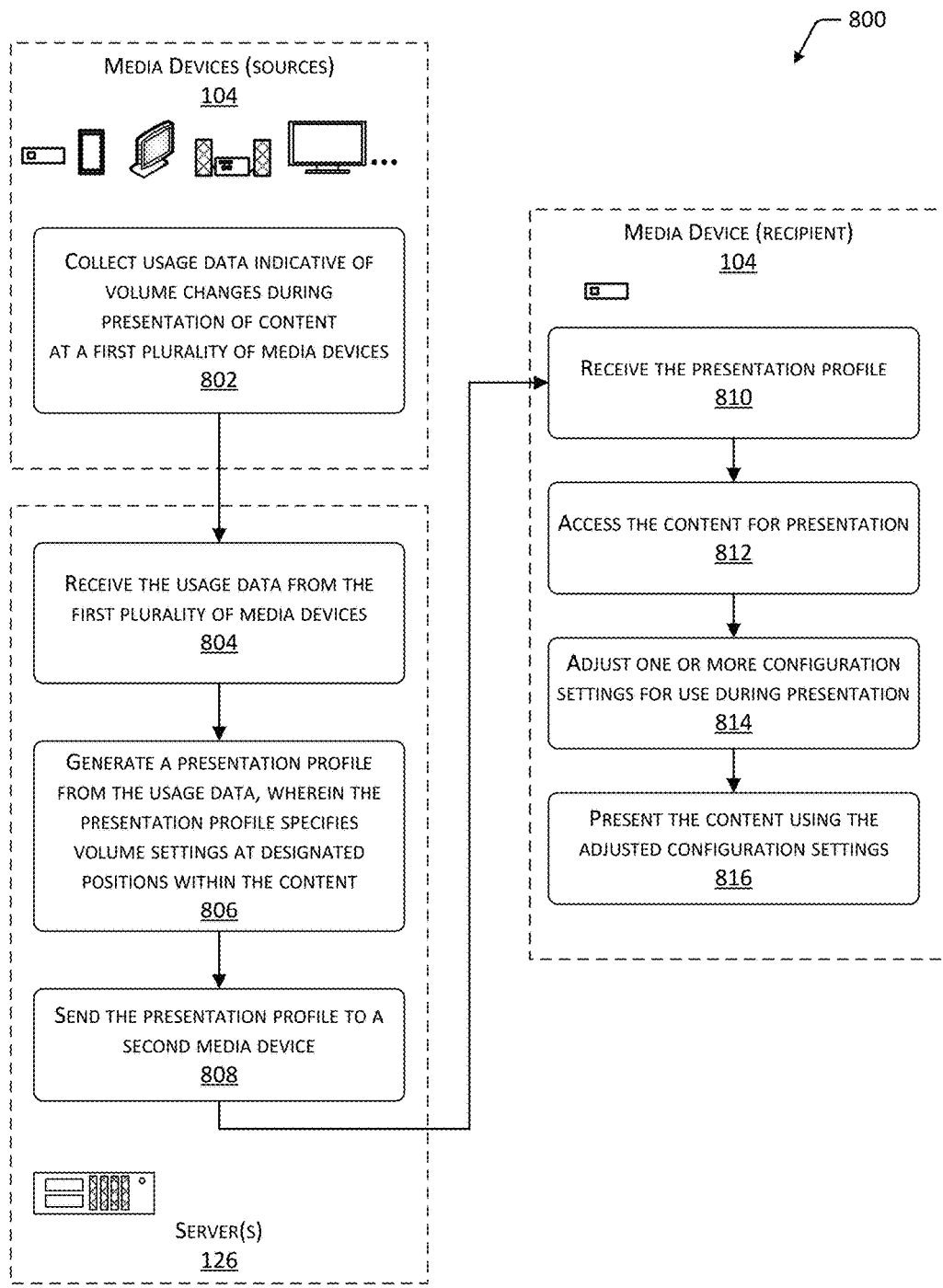
FIG. 8 illustrates a flow diagram of a process of generating and using a presentation profile.

FIG. 8 illustrates a flow diagram 800 of a process of generating and using a presentation profile 118. The process may be performed at least in part by the data acquisition module 114, the profile generation module 130, and so forth. In this illustration the various blocks are depicted within boxes drawn with dashed lines to indicate which device may be performing the actions described. For example, block 802 is depicted as occurring on the source media devices 104, blocks 804 through 808 are depicted as occurring on the server 126, and blocks 810 through 816 are depicted as occurring on the recipient media device 104. It is understood that the actions described may occur at least in part on other devices. It is also recognized that in some implementations the recipient media device 104 may also be a source media device 104 and vice versa.

Block 802 collects usage data 116 at a first plurality of media devices 104. For example, the data acquisition module 114 may access the log data 622 of a source media device 104 and determine the configuration data 122. The usage data 116 may be generated from data acquired during presentation of the content 112. For example, the usage data 116 may be generated by the data acquisition module 114 after accessing log data 622 showing events which occurred during presentation of the content 112. The data acquisition module 114 may also interrogate the OS module 108, access sensors, and so forth to determine environment data 120.

In the example depicted in this illustration, the usage data 116 includes position data 216 and volume level data 218 associated with changes in audio volume made by the user 102. The first plurality of media devices 104 may comprise portable media devices such as tablets, portable media players, smartphones, and so forth. These media devices 104 may be configurable to present audio of the content 112 using onboard speakers. The output volume level from the onboard speakers may be adjustable by the user 102 with one or more controls. For example, the tablet may include a pair of buttons which allow for adjustment of the volume produced by the onboard speakers.

Block 804 receives the usage data 116 from the first plurality of the media devices 104. For example, the media devices 104 may transmit the usage data 116 during presentation of the content 112, may send daily or weekly updates to the server 126 which include the usage data 116, and so forth.

Block 806 generates the presentation profile 118 from the usage data 116. In this illustration, the presentation profile 118 specifies volume settings as volume configuration data 234 at designated positions indicated by position configuration data 232. For example, the presentation profile 118 may specify that volume is to be increased by 10% above an origin value. The presentation profile 118 may be configured to modify operation of the recipient media device 104 before, during, or both before and during presentation.

In some implementations, the presentation profile 118 may be specific to a particular presented content identifier 202 and a particular set of environment data 120 indicative of a particular environment. In this implementation, the generating of the presentation profile 118 may include the following blocks (which are not depicted).

A first block determines a presented content identifier 202 indicative of the content 112 presented by the plurality of source media devices 104. For example, the particular movie "Short Circuit".

A second block determines environment data 120 indicative of an environment present at the plurality of source media devices 104 during presentation. For example, the second block may determine that the environment data 120 indicates that the media device 104 is in an environment in which the AVR media device 104(3) is coupled to the STB media device 104(1), the ambient noise level is below a threshold value, and the time of presentation is after 9 PM local time.

A third block determines changes to the configuration of at least a portion of the plurality of source media devices 104 during presentation of the content 112. For example, the changes may correspond to particular positions 308 in the content 112 during presentation of the content 112, as specified by position data 216. The changes at the positions 308 may be determined by using one or more techniques. These techniques may include, for each of the particular positions 308, one or more of designating and discarding outlier values, calculating an average of the values, calculating a minimum of the values, calculating a maximum of the values, calculating a mode of the values, and so forth. The resulting values may then be associated with position configuration data 232 which indicates the particular positions 308. For example, the position configuration data 232 for time index 01:03:12 may be associated with volume configuration data 234 to increase volume by 10%.

Block 808 sends the presentation profile 118 to a second or recipient media device 104. The presentation profile 118 may be sent contemporaneously with content 112, before sending the content 112, or after sending the content 112. For example, the presentation profile 118 may be sent contemporaneously by embedding the presentation profile 118 as a stream of data within the content 112.

Continuing the example depicted in this illustration, the second or recipient media device 104 may be configured differently than the source media device 104. For example, the second media device 104 may be a headless media device such as the STB media device 104(1) which is configurable to present audio of the content 112 using an external device. The media device 104 is "headless" in that onboard or built-in output devices are limited or nonexistent, and relies on the external device to provide output to the user 116. The external device may comprise a dedicated output device or another media device 104. For example, the external device may include one or more of a television media device 104(2) with onboard speakers, the AVR media device 104(3), and so forth. Continuing the example, the external devices which provide audio output may include elements such as digital-to-analog converters, audio amplifiers, and so forth.

In some implementations, environment data 120 which is indicative of an environment of the recipient media device 104 may be obtained or accessed. The presentation profile 118 sent to the second media device 104 may be selected based on a correspondence with the received environment data 120. For example, should the received environment data 120 indicate that the recipient media device 104 has attached headphones, the server 126 may select and provide a presentation profile 118 which is configured for use with headphones.

In other implementations, the content 112 may be modified before distribution to the media device 104. For example, the presentation profile 118 may be applied to the content 112 and used to generate another version of the content 112, or provide pre-processed content 112 as modified based on the presentation profile 118. This modified version may then be presented to the media device 104 for presentation.

Block 810 receives the presentation profile 118. For example, the content distribution module 128 may provide the content 112 along with the corresponding presentation profile 118. In some implementations the presentation module 110 or another module on the recipient media device 104 may select from among a plurality of available presentation profiles 118 which are stored in the memory 610. As described above with regard to block 808, the selection in some implementations may be based on the environment data 120 of the recipient media device 104. For example, the recipient media device 104 may request the presentation profile 118 based at least in part on the environment data 120 or a change thereto.

Block 812 accesses the content 112 for presentation. For example, the presentation module 110 may retrieve the portion of the content 112 which is stored in the memory 610. In some implementations, the access may include acquisition of license keys, authentication, decryption, or other cryptographic operations.

Block 814 adjusts one or more configuration settings for use during presentation. In the example depicted here, the volume settings may be increased by 10% above a threshold value at the specified position in the content 112. The adjustment may be made to one or more of the amplitude of an audio stream or a level of amplification applied to an audio stream. For example, the modified audio stream 510 may be generated which has amplitude increased by 10% compared to the unmodified audio stream 502. Or, CEC "System Audio Control" commands may be issued to the AVR media device 104(3) to increase amplification by 10%.

In another example, the adjustment may comprise designating a particular controller 106 as an input device for the content 112. In yet another example, the adjustment may comprise changing an acceleration level specifying a rate at which an input to a pointer input device affects apparent motion of a pointer in a user interface. In still another example, the adjustment may comprise designating an overscan state to present a portion of images on a display device.

Where the content 112 has been modified based on the presentation profile 118 prior to distribution to the media device 104, block 814 may be omitted. In another implementation, another presentation profile 118 may be used to adjust the configuration settings for presentation of the modified content 112. For example, two different presentation profiles 118(8) and 118(9) may be applied, one by the server 126 prior to distribution and one at the media device 104.

Block 816 presents the content 112 using the adjusted configuration settings. Continuing the example, the presentation may include generating an audio stream, such as the unmodified audio stream 502. Based on the presentation profile 118, the amplitude data of the unmodified audio stream 502 is changed to generate the modified audio stream 510. For example, the values of the amplitude data may be increased by 10%, thus amplitude data which has a decimal value of "50" may be changed to a value of "55". The modified audio stream 510 which includes changed amplitude data may then be presented.

The presentation may include sending the modified audio stream 510 to an output device or media device 104 as a digital signal, such as PCM. The output device receives the digital signal and converts the modified audio stream 510 to an analog signal, such as with a digital to analog converter. The analog signal may be fed to an analog amplifier which provides an amplified analog signal to operate a speaker. As a result of the changed amplitude data present in the modified audio stream 510, the amplitude of the amplified signal has been changed without modifying an overall amplification level of the output device. For example, the presented audio 514 is louder in some portions and quieter in others without the user 102 changing a volume control on the AVR media device 104(3).

As described elsewhere in this disclosure, in some implementations the recipient media device 104 may provide additional usage data 116 to the profile generation module 130. The profile generation module 130 may use this additional usage data 116 to modify or otherwise change the presentation profile 118.

Those having ordinary skill in the art will readily recognize that certain steps or operations illustrated in the figures above can be eliminated or taken in an alternate order. Moreover, the methods described above may be implemented as one or more software programs for a computer system and are encoded in a computer readable storage medium as instructions executable on one or more processors.

Embodiments may be provided as a computer program product including a nontransitory computer readable storage medium having stored thereon instructions (in compressed or uncompressed form) that may be used to program a computer (or other electronic device) to perform processes or methods described herein. The computer readable storage medium can be any one of an electronic storage medium, a magnetic storage medium, an optical storage medium, a quantum storage medium and so forth. For example, the computer readable storage media may include, but is not limited to, hard drives, floppy diskettes, optical disks, read-only memories (ROMs), random access memories (RAMs), EPROMs, EEPROMs, flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of machine-readable signals, whether modulated using a carrier or not, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across separate computer systems. Thus, although certain steps have been described as being performed by certain devices, software programs, processes, or entities, this need not be the case and a variety of alternative implementations will be understood by those having ordinary skill in the art.

Additionally, those having ordinary skill in the art readily recognize that the techniques described above can be utilized in a variety of devices, environments and situations. Although the present disclosure is written with respect to specific embodiments and implementations, various changes and modifications may be suggested to one skilled in the art and it is intended that the present disclosure encompass such changes and modifications that fall within the scope of the appended claims.

What is claimed is:

1. A system comprising:
   at least one communication interface;
   at least one memory to store computer-executable instructions;
   at least one hardware processor in communication with the at least one communication interface and the at least one memory, wherein the at least one hardware processor is configured to execute the computer-executable instructions to:
      receive usage data from a first plurality of media devices, the usage data comprising, for a first media device of the first plurality of media devices:
         a presented content identifier indicative of content, wherein the content includes audio data that was processed into an audible output by the first media device during presentation of the content,
         a position within the content, and
         media device state data indicative of at least an output volume level as set by a user of the first media device to control volume of audio emitted during the presentation of the content at the position;
      generate a presentation profile from the usage data, wherein the presentation profile is used to configure, without user intervention, at least presentation of audio emitted at designated positions within the content associated with the content identifier during subsequent presentation of the content; and
      send the presentation profile to a second media device.

2. The system of claim 1, wherein:
the first plurality of media devices comprises portable media devices configurable to present the audio of the content using onboard speakers, and further wherein the output volume level from the onboard speakers is adjustable by way of one or more controls of the portable media devices; and
the second media device comprising:
  at least one second communication interface configurable to communicate with at least one external device, the at least one external device configured to:
    convert an audio stream from a digital signal to an analog signal;
    amplify the analog signal to generate audio output; and
  the at least one external device comprising one or more of:
    a television having one or more speakers,
    at least one audio/video receiver coupled to one or more speakers, or
    at least one amplifier coupled to one or more speakers;
  at least one second memory, storing computer-executable instructions;
  at least one second hardware processor in communication with the at least one second communication interface and the at least one second memory, wherein the at least one second hardware processor is configured to execute the computer-executable instructions to:
    based on the presentation profile, change amplitude data of the audio stream of the content according to the output volume level; and
    send the audio stream having the changed amplitude data to the at least one external device for presentation of the audio.

3. The system of claim 1, the second media device comprising:
  at least one second communication interface;
  at least one second memory, storing second computer-executable instructions;
  at least one second hardware processor in communication with the at least one second communication interface and the at least one second memory, wherein the at least one second hardware processor is configured to execute the second computer-executable instructions to:
    receive the presentation profile;
    access the content;
    generate an audio stream for the content;
    based on the presentation profile, change amplitude data of the audio stream; and
    present the audio stream with the changed amplitude data.

4. A method comprising:
receiving a plurality of usage data from a plurality of media devices, wherein the plurality of usage data comprises, from a first media device of the plurality of media devices:
  a presented content identifier indicative of content presented on the first media device; and
  media device state data indicative of an output volume level to control volume of audio emitted during presentation of the content at a position within the content;
generating a presentation profile based on the plurality of usage data, the presentation profile used to configure at least presentation of the audio of the content at a recipient media device for subsequent presentation of the content; and
sending the presentation profile to the recipient media device.

5. The method of claim 4, wherein the media device state data comprises volume level data indicative of a change in the output volume level from a first output volume level associated with a first position in the content to a second output volume level associated with a second position in the content which is subsequent to the first position.

6. The method of claim 4, wherein the plurality of usage data further comprises one or more of:
  identity of a user logged in to the first media device,
  ambient noise level as detected by a microphone of the first media device,
  time, or
  geographic location of the first media device.

7. The method of claim 4, wherein the plurality of usage data further comprises data associated with one or more positions within the content during presentation, the position indicated by one or more of:
  a time index,
  a frame number,
  a scene indicator,
  a game level, or
  a byte count.

8. The method of claim 4, the media device state data further comprising information indicative of one or more of:
  volume level data indicative of the output volume level of the audio during presentation of the content by the first media device,
  audio equalizer data indicative of relative amplification or attenuation of frequency bands during presentation of the content by the first media device,
  selected controller data indicative of a controller selected for use during presentation of the content by the first media device,
  overscan selection data indicative of activation of an overscan mode during presentation of the content by the first media device,
  pointer acceleration data indicative of acceleration applied to cursor movement, or
  display brightness data indicative of a change in intensity of a display backlight.

9. The method of claim 4, further comprising:
  receiving environment data from the recipient media device indicative of an environment of the recipient media device for the presentation of the content; and
  selecting the presentation profile corresponding to the received environment data.

10. The method of claim 4, wherein the content comprises a game and the plurality of usage data is associated with play at a particular achievement level of the game.

11. The method of claim 4, wherein the presentation profile is associated with a particular content identifier indicative of particular content.

12. The method of claim 4, wherein the presentation profile is associated with a particular content category, the particular content category designating the content as a game, movie, television, audiobook, or music.

13. The method of claim 4, further comprising:
  receiving second usage data from the recipient media device; and modifying the presentation profile using the second usage data.

14. The method of claim 4, the generating the presentation profile comprising:
  determining data indicative of an environment present at the first media device during presentation;
  determining changes to configuration of the first media device during presentation of the content, wherein the changes correspond to particular positions in the content during presentation of the content; and
  for one or more of the determined changes at the particular positions performing one or more of:
    designating and disregarding outlier values,
    calculating an average of values that are associated to the changes to the configuration of the first media device of the plurality of media devices during the presentation of the content,
    calculating a minimum of values that are associated to the changes to the configuration of the first media device of the plurality of media devices during the presentation of the content,
    calculating a maximum of values that are associated to the changes to the configuration of the first media device of the plurality of media devices during the presentation of the content, or
    calculating a mode of values that are associated to the changes to the configuration of the first media device of the plurality of media devices during the presentation of the content.

15. A system comprising:
  at least one communication interface;
  at least one memory to store computer-executable instructions;
  at least one hardware processor in communication with the at least one communication interface and the at least one memory, wherein the at least one hardware processor is configured to execute the computer-executable instructions to:
    receive a plurality of usage data from a plurality of media devices, wherein the plurality of usage data comprises, for a first media device of the plurality of media devices:
      a presented content identifier indicative of content presented on the first media device; and
      configuration data indicative of one or more configuration settings of the first media device during presentation of the content, wherein the one or more configuration settings includes at least an output volume level to control volume of audio emitted during presentation of the content at a position within the content;
    generate a presentation profile based on the plurality of usage data, the presentation profile used to configure at least presentation of the content at a recipient media device for a subsequent presentation of the content; and
    send the presentation profile to the recipient media device.

16. The system of claim 15, the recipient media device comprising:
  at least one second communication interface to receive at least the presentation profile;
  at least one second memory to store second computer-executable instructions;
  at least one second hardware processor in communication with the at least one second communication interface and the at least one second memory, wherein the at least one second hardware processor is configured to execute the second computer-executable instructions to:
    access the presentation profile comprising the one or more configuration settings associated with particular positions within the content;
    access the content for presentation; and
    based on the presentation profile, adjust presentation of the content.

17. The system of claim 16, the second computer-executable instructions are further configured to:
  determine a change in environment data, the environment data indicative of one or more of:
    identity of a logged in user,
    connected device data indicative of a change in a connection state of one or more output devices,
    ambient noise level as detected by a microphone, or
    geographic location; and
  request the presentation profile, based at least in part on the change in the environment data.

18. The system of claim 16, the recipient media device further comprising:
  a controller configured to accept user input and send data indicative of the user input to the hardware processor; and
  wherein the adjustment of the presentation of the content comprises designating the controller as an input device for the content.

19. The system of claim 16, the recipient media device further comprising:
  a pointer input device; and
  wherein the adjustment of the presentation of the content comprises changing an acceleration level specifying a rate at which an input to the pointer input device affects apparent motion of a pointer in a user interface.

20. The system of claim 16, the recipient media device further comprising:
  an output device configured to:
    convert an audio stream from a digital signal to an analog signal;
    amplify the analog signal to generate audio output;
  wherein the adjustment of the presentation of the content comprises changing amplitude data of the audio stream of the content according to the one or more configuration settings indicative of volume configuration data; and
  the second computer-executable instructions are further configured to:
    send the audio stream having the changed amplitude data to the output device.

* * * * *